Jan. 9, 1962 B. C. DE LOACH, JR., ET AL 3,016,499

MICROWAVE DEVICE

Filed May 12, 1960 2 Sheets-Sheet 1

INVENTORS: B.C. DE LOACH JR.
D. H. RING

BY Sylvan Sherman

ATTORNEY

Jan. 9, 1962 B. C. DE LOACH, JR., ET AL 3,016,499

MICROWAVE DEVICE

Filed May 12, 1960 2 Sheets-Sheet 2

INVENTORS: B. C. DE LOACH JR.
D. H. RING

BY Sylvan Sherman

ATTORNEY

United States Patent Office 3,016,499
Patented Jan. 9, 1962

3,016,499
MICROWAVE DEVICE

Bernard C. De Loach, Jr., Little Silver, and Douglas H. Ring, Red Bank, N.J., assignors to Bell Telephone Laboratories, Incorporated, New York, N.Y., a corporation of New York Filed May 12, 1960, Ser. No. 28,624
3 Claims. (Cl. 333—33)

This invention relates to microwave parametric oscillators and amplifiers and, in particular, to means for tuning and coupling to such devices.

Low-noise amplification at microwave frequencies has, for many years, been exclusively achieved by means of vacuum tube amplifiers. Within the last two years, however, there has been developed a class of solid state amplifiers which, in many respects, is superior to the prior art vacuum tube devices.

The transition to solid state amplifiers, however, has not been without its problems. These arise, in part, from the fact that the energy supplied to the signal during the amplification process is derived from a relatively high power, high frequency source, generally referred to as the pump generator which, in the absence of special precautions, appears as a large spurious component of wave energy in the signal circuit.

While the amplifier can be tuned and otherwise adjusted so as to minimize the spurious signal level in the output circuit for any given set of operating conditions, changes in the amplifier generally necessitate a series of adjustments to retune the amplifier and re-establish the preferred operating conditions. For instance, in a typical situation where it is desired to reduce or to increase the coupling to or from the amplifier, or where the active element, such as the voltage sensitive diode in a variable capacitance parametric amplifier, is replaced, the amplifier must be readjusted. One of these readjustments relates to the elimination of the spurious pump energy from the signal circuit and is, therefore, of considerable importance.

It is, therefore, the general object of this invention to simplify the tuning and coupling adjustments for microwave parametric amplifiers and oscillators.

It is a more specific object of the invention to make said tuning and coupling adjustments substantially independent of each other.

According to the invention, the signal coupling means is introduced into the amplifier through one of the tuning pistons bounding the signal cavity. The distance from the piston's effective shorting plane to the pickup element, located at the end of the coupling means, is adjusted so that the transmission coefficient for the pump frequency is minimized. Vernier control of the longitudinal movement of the entire piston assembly within the amplifier signal cavity is provided for signal tuning purposes. Additional means are provided for locking the tuning control mechanism and for varying the degree of coupling by rotating the coupling means about an axis normal to the appropriate field components within the amplifier signal cavity.

It is a feature of the invention that the various adjustments may be made independently of each other, thus greatly simplifying the adjustment and control of a parametric amplifier or oscillator.

These and other objects and advantages, the nature of the present invention, and its various features, will appear more fully upon consideration of the various illustrative embodiments now to be described in detail in connection with the accompanying drawings, in which.

Figure 1:
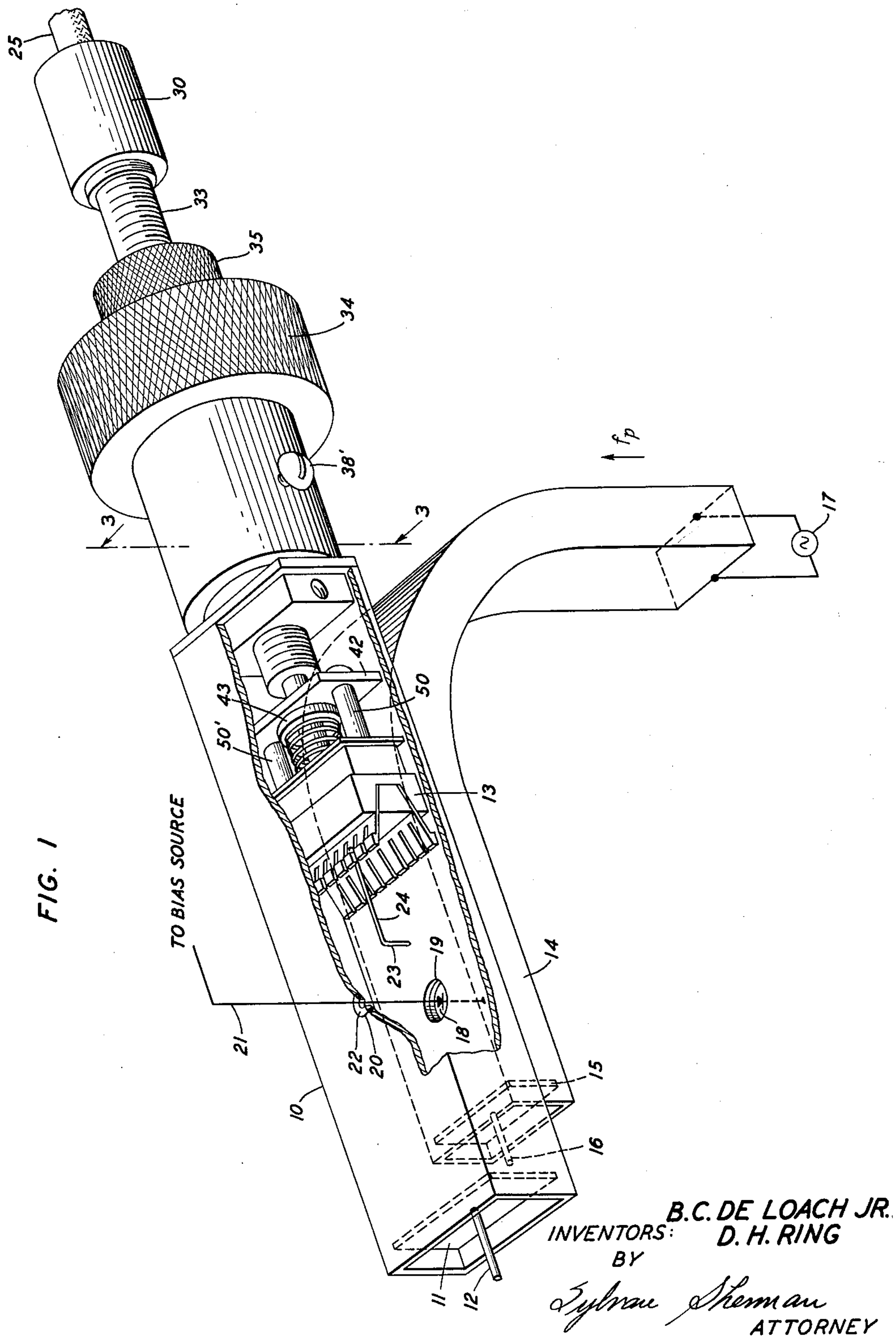
FIG. 1 shows, in perspective, a microwave parametric amplifier and the amplifier control mechanism in accordance with the invention.

Referring more specifically to FIG. 1, a variable capacitive parametric amplifier is shown as an illustrative embodiment of the present invention. The amplifier comprises a first section 10 of bounded electrical transmission line for guiding electromagnetic wave energy which may be a rectangular waveguide of the metallic shield type having a wide internal cross-sectional dimension of at least one-half wavelength of the wave energy to be supported therein, and a narrow dimension substantially one-half of the wide dimension. So proportioned, this waveguide is supportive of signal wave energy in the dominant mode, known in the art as the $TE_{10}$ mode, in which the electric lines of force extend from the bottom to the top of the waveguide, perpendicular to the wide guide walls.

Guide 10 is terminated at one end by the transverse shorting piston 11, whose relative longitudinal position along the guide may be changed by means of the control plunger 12. The other end of guide 10 is similarly terminated by means of a second transverse shorting piston 13. The latter terminating mechanism, shown in some detail in FIG. 1, will be further described in greater detail hereinafter.

Located adjacent to guide 10, and running for at least a portion of its length contiguous and parallel thereto is a second section of transmission line 14, which may also be a rectangular waveguide proportioned to support wave energy in the dominant mode at the pump frequency to be propagated therein. As shown in FIG. 1, guides 10 and 14 share a portion of wide wall in common and are transversely positioned relative to each other so that guide 14 is symmetrically located between the narrow walls of guide 10. Guide 14 could, however, cross guide 10 at an angle, if desired.

Terminating guide 4 at one end is the transverse shorting piston 15, whose relative longitudinal position along guide 14 may be varied by means of the control plunger 16. The other end of guide 14 is connected to a source 17 of high frequency pumping energy of frequency $f_p$.

Coupling between waveguide 14 and the cavity formed by guide 10 and shorting members 11 and 13, hereinafter referred to as cavity 10, is effected by means of a common reactive element. In the embodiment of FIG. 1, said element comprises the voltage sensitive capacitive diode 18, one end of which extends transversely through an aperture 19 located in the center of the common wide wall portion, and conductively connects to the bottom wide wall of guide 14. The upper end of diode 18 extends transversely across cavity 10 and through aperture 20 centrally located in the upper wide wall of said cavity. Upon emerging from cavity 10, the diode lead is conductively connected by means of a wire 21 to a source of biasing potential.

Inserted in aperture 20 is a ring of insulating material 22 which, in addition to conductively insulating the upper end of diode 18 from the metallic guide wall, comprises a low impedance to the high frequency signals thus confining the high frequency wave energy to within the waveguide structure.

In operation, pumping energy at frequency $f_p$ is applied to waveguide 14 from generator 17. Shorting piston 15 is adjusted to produce maximum voltage variation at the pumping frequency across diode 18. Cavity 10 is adjusted by means of pistons 11 and 13 to resonate at the subharmonic frequency $f_p/2$.

Coupling out of cavity 10 is accomplished by means of probe 23. As shown in FIG. 1, probe 23 is oriented perpendicular to the wide walls of cavity 10 and consequently parallel to the direction of the electric field vectors therein.

With both waveguides properly terminated, and the pumping signal power level increased so as to exceed the threshold level, oscillations at the subharmonic frequency are generated in cavity 10. However, because cavity 10 is also supportive of the pumping frequency, a substantial signal at the pumping frequency is also established in cavity 10 which, in the absence of special precautions, appears in the subharmonic signal circuits as a high level spurious signal.

As indicated above, in the adjustment of a parametric amplifier or oscillator, it is necessary to match the variable reactive element to the microwave circuit. In addition, it is most important that the signal frequency be isolated from other undesirable signals that can be introduced into or generated in the amplifier and that the coupling between the parametric device and the external signal circuits be variables. All these objectives are accomplished, in accordance with the invention, by means of the coupling arrangement shown in the embodiment of FIG. 1. As therein shown, the coupling probe 23 is introduced into the signal cavity 10 through an aperture in piston 13. Specifically, probe 23 is connected to the center conductor 24 of a coaxial cable 25 which runs throughout the extent of the piston control mechanism and emerges therefrom at the far right end.

Figure 2:
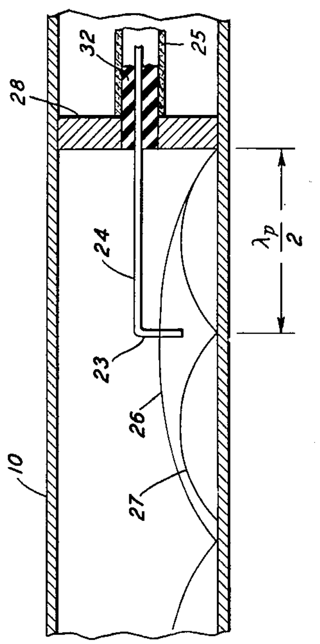
FIG. 2 shows, by way of explanation, the field distribution and location of the pickup probe in the signal cavity of the parametric amplifier.

Probe 23 extends into cavity 10 from the effective shorting plane of piston 13, a distance corresponding to a half wavelength of the pump frequency, which corresponds to a region of minimum electric field intensity. This is illustrated in FIG. 2 where there is shown a simplified version of the coupling arrangement of FIG. 1. FIG. 2 shows the center conductor 24 of coaxial cable 25 extending through a piston 28 into cavity 10 a distance equivalent to half a wavelength at the pump frequency $f_p$. At the end of conductor 24 is the probe 23 set at right angles thereto. Also shown are the signal standing wave pattern 26, which is approximately a maximum at the position of probe 23, and the standing wave pattern 27, of the pumping signal, which is a minimum at that point. So positioned, probe 23 couples substantially exclusively to the signal field, reducing to a minimum the level of spurious pumping signal introduced into the signal output circuit.

Furthermore, with the coaxial cable 25 rigidly attached to piston 13, a given coupling orientation is not disturbed by longitudinally adjusting piston 13 during the tuning operation; that is, at the given operating frequency for which the length of conductor 24 is adjusted, probe 23 is always at the preferred coupling position regardless of the specific position of piston 13.

In FIG. 1 probe 23 is shown directed perpendicular to the wide walls of cavity 10. This alignment corresponds to the direction of the electric field vectors in the cavity and is therefore the position of maximum coupling. To vary the coupling, means are provided for rotating probe 23 about an axis colinear with conductor 24. In particular, the signal induced in probe 23 is reduced as the probe is rotated out of coincidence with the direction of the electric field vectors. With probe 23 directed parallel to the wide walls of cavity 10 (or perpendicular to the electric field vectors) substantially no signal is induced in probe 23 and the output is reduced to zero. As the probe is further rotated so as to point upward, the output signal again increases.

Figure 3:
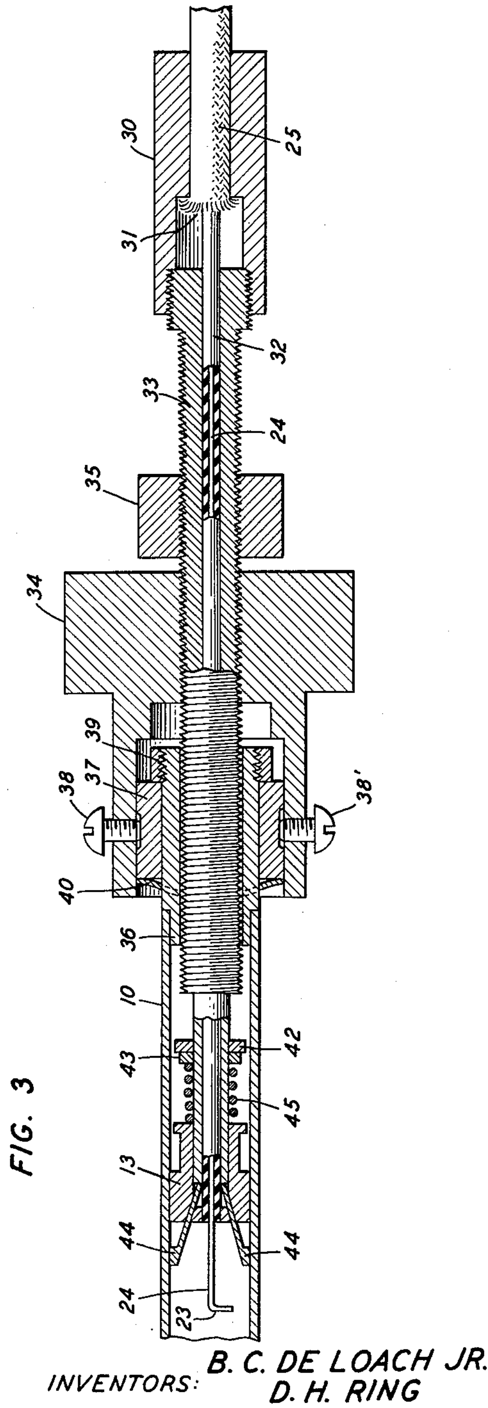
FIG. 3 shows, in greater detail, a longitudinal section of the control mechanism of FIG. 1.

In FIG. 3 the control mechanism for controlling the position of piston 13 and the orientation of probe 23 is shown in detail.

FIG. 3 shows, in cross-sectional view, the piston and probe control mechanism in accordance with the invention, comprising a hollow cable supporting member 33, a portion of the outer surface of which is threaded. Coaxial cable 25 is received at one end of member 33 and is secured thereto by means of the coaxial cable clamp 30, the outer conductive sheath 31 of cable 25 being conductively terminated at said clamp. The center conductor 24 extends through, and an appropriate distance beyond, the end of member 33, terminating at the proble 23, which is merely the bent extension of conductor 24. Conductor 24 is conductively insulated from the cable support member 33 by means of the insulating material 32 which extends throughout the length of member 33.

Threaded onto the threaded portion of member 33 are the drive knob 34 and the drive knob locknut 35. Accommodated in the cylindrical recess of knob 34 and slidably received over the threaded portion of member 33 is the waveguide support 36, upon which waveguide 10 abuts. Surrounding support 36 is the drive centering sleeve 37 which is locked in position, relative to the drive knob 34, by means of screws 38 and 38'. The waveguide support 36 is maintained in position within the drive knob recess by means of the centering sleeve locknut 39 which is rigidly connected to support 36 and abuts upon sleeve 37 and the drive tension spring 40, which maintains a light pressure between sleeve 37 and guide support 36.

At the probe end of the control mechanism, cable support 33 is slidably received by, and terminated within, the piston head 13. The latter is maintained in position by means of a pair of standoff columns (50 and 50', FIG. 1) which connnect the piston head 13 to the piston head plate 42. The latter, in turn, abuts upon a washer 43 which is securely connected to cable support 33. The piston head tension spring 45 maintains a slight pressure against the piston head, thereby keeping plate 42 in contact with washer 43. Also connected to piston head 13 are the piston head fingers 44 which maintain pressure against the inside of guide 10 for producing good electrical contact therewith.

When it is desired to produce longitudinal movement of the piston head within guide 10, as, for example, for tuning the resonant cavity, the piston drive knob is rotated. With the drive knob fixed in position with respect to guide 10, the cable support member 33 is caused to move longitudinally, thus causing the piston head to move longtiudinally within cavity 10 as a result of said rotation.

After the completion of the tuning operation, the drive knob is locked in position by tightly threading the drive knob locknut 35 up against the drive knob. So locked, any attempt to rotate the drive knob will cause the cable support member 33 to rotate, thereby varying the electrical coupling to cavity 10, as explained in detail hereinbefore. There will, however, be no further displacement of the piston head.

While the embodiment of FIG. 1 was characterized as an oscillator, it is understood that by reducing the pumping power below the threshold level of oscillation, the same structure can be utilized as an amplifier. When so utilized, signal energy is introduced into cavity 10 by means of probe 23 and amplified signal energy is extracted from cavity 10 by means of probe 23. Means, such as a three-port circulator (not shown) for separating the signal source from the signal load circuit, are connected to coaxial cable 25 in a manner well known in the art. Alternatively, two coupling connections may be used, one for the input and one for the output. In accordance with the invention, the second coupling connection may be provided in piston 11 if desired.

In all cases it is understood that the above-described arrangements are illustrative of a small number of the many possible specific embodiments which can represent applications of the principles of the invention. Numerous and varied other arrangements can readily be devised in accordance with these principles by those skilled in the art without departing from the spirit and scope of the invention.

What is claimed is:

1. A resonant cavity supportive of electromagnetic wave energy at a first frequency $f_1$ and at a second frequency $2f_1$ comprising a section of rectangular waveguide having longitudinally adjustable shorting members transversely disposed across said section, a coaxial cable extending through one of said members with the inside conductor of said cable extending into said cavity a distance equal to approximately one half a wavelength at said second frequency $2f_1$ and at said distance being bent at right angles to itself to form a conductive probe, the outer conductor of said cable having a threaded portion along its outer surface, a rotatable control knob supported in a fixed relative position with respect to said cavity in threaded contact with said portion, and means for locking said knob to said outer conductor.

2. A tunable electromagnetic wave energy supporting structure having a longitudinal adjustable tuning piston, means for energizing said structure at a first frequency $f_1$ and at a second frequency $2f_1$, means for coupling to wave energy at said first frequency $f_1$ and simultaneously minimizing the transmission coefficient for wave energy at said second frequency $2f_1$ extending into said structure through said piston, means for adjusting said piston and means for varying said coupling comprising a hollow cylindrical shaft having a portion of its outside surface threaded at one end, a rotatable control knob and a rotatable control knob locknut threadably engaged with said threaded portion, the other end of said shaft being rotatably mounted in said piston, an elongated conductive element disposed within and conductively insulated from said member extending from said one end to said other end and through said piston into said structure, and means for maintaining said control knob in a fixed relative position with respect to said structure.

3. A resonant cavity supportive of harmonically related wave energy in the $TE_{10p}$ cavity mode comprising a section of rectangular waveguide having longitudinally adjustable shorting members transversely disposed across said section, means for energizing said cavity at a first frequency $f_1$, means for energizing said cavity at a second frequency $2f_1$, a first elongated conductive element extending through and conductively insulated from one of said members, said first element extending into said cavity in a direction parallel to the walls of said guide, a second elongated conductive element disposed at right angles to said first element and electromagnetically coupled thereto, said second element being located in a region of said cavity wherein the electric field intensity at said first frequency is substantially a maximum whereas the electric field intensity at said second frequency is substantially a minimum, and means for rotating said second element about an axis colinear with said first element.

References Cited in the file of this patent

UNITED STATES PATENTS

| | | |
|---|---|---|
| 2,428,287 | Linder | Sept. 30, 1947 |
| 2,899,647 | Willwacher | Aug. 11, 1959 |
| 2,922,963 | Beatty | Jan. 26, 1960 |